(12) United States Patent
Zoellin et al.

(10) Patent No.: US 9,139,418 B2
(45) Date of Patent: Sep. 22, 2015

(54) MEMS COMPONENT

(71) Applicants: Jochen Zoellin, Muellheim (DE); Christoph Schelling, Stuttgart (DE)

(72) Inventors: Jochen Zoellin, Muellheim (DE); Christoph Schelling, Stuttgart (DE)

(73) Assignee: ROBERT BOSCH GMBH, Stuttgart (DE)

(*) Notice: Subject to any disclaimer, the term of this patent is extended or adjusted under 35 U.S.C. 154(b) by 0 days.

(21) Appl. No.: 14/157,344

(22) Filed: Jan. 16, 2014

(65) Prior Publication Data
US 2014/0225205 A1 Aug. 14, 2014

(30) Foreign Application Priority Data

Jan. 22, 2013 (DE) .................. 10 2013 200 904

(51) Int. Cl.
*B81B 3/00* (2006.01)
*B81B 7/02* (2006.01)
*H04R 1/00* (2006.01)
*H04R 19/00* (2006.01)

(52) U.S. Cl.
CPC ............... *B81B 3/0021* (2013.01); *B81B 3/00* (2013.01); *B81B 3/0035* (2013.01); *B81B 7/02* (2013.01); *H04R 1/00* (2013.01); *H04R 19/00* (2013.01); *H04R 19/005* (2013.01); *H04R 2201/003* (2013.01)

(58) Field of Classification Search
CPC .......... B81B 3/0021; B81B 7/02; B81B 3/00; B81B 3/0035; H04R 1/00
See application file for complete search history.

(56) References Cited

U.S. PATENT DOCUMENTS

| 6,535,460 B2 | 3/2003 | Loeppert et al. | |
| 7,057,251 B2 * | 6/2006 | Reid ............................. | 257/432 |
| 2010/0258883 A1 * | 10/2010 | Wu et al. ....................... | 257/415 |

* cited by examiner

*Primary Examiner* — William Coleman
(74) *Attorney, Agent, or Firm* — Kenyon & Kenyon LLP

(57) ABSTRACT

An MEMS component includes at least one metal-ceramic multilayer stack as a mechanical functional layer in the layered structure of the MEMS component. The metal-ceramic multilayer stack functions as a mechanical functional layer in which at least one component of the micromechanical structure of the MEMS component is configured.

8 Claims, 3 Drawing Sheets

MEMS COMPONENT

BACKGROUND OF THE INVENTION

1. Field of the Invention

The present invention relates to an MEMS component, whose micromechanical structure is realized in a layered structure on a substrate, individual components of the micromechanical structure being essentially configured in each case in a mechanical functional layer of this layered structure.

2. Description of the Related Art

An MEMS component of this type is described, for example, in U.S. Pat. No. 6,535,460 B2. Here, the MEMS component includes a micromechanical microphone structure having an acoustically active diaphragm that is configured in a first mechanical functional layer and spans a sound port in the substrate rear side. A fixed counter element is configured in another mechanical functional layer above the diaphragm, spaced apart from the same. The counter element has perforations, making it acoustically transmissive. The signals are acquired capacitively in that the diaphragm functions as a movable electrode and, together with a fixed electrode on the counter element, forms a capacitor system. The layered structure and the microphone structure of the known MEMS microphone component are produced using microsystems technology, semi-conductive, dielectric, metallic and/or plastic-based layered materials being used.

In the case of mechanical functional layers of micromechanical components of this kind, it is mostly a question of layers of semiconductive material and/or of layers of dielectric material that are deposited at very high temperatures ranging from 500° C. to over 1000° C. In this case, only thin-layer materials and processes may be used beforehand in the manufacturing process that withstand the high deposition temperatures. It is important that the temperatures that the component is subject to during the manufacture thereof do not lead to an unintentional change in the properties of the individual layers of the layered structure, such as, for example, to a change in the layer strain or in the layer conductivity caused by a compression of the initially polycrystalline layer material. This can result, namely, in cracks forming in individual layers, for example, and/or in high stress gradients within the layered structure that lead to deformation of the component structure. Plastics can then be used only in the course of the manufacturing process, for example, as a passivation or sacrificial layer, when the subsequent processes are carried out at temperatures significantly below the decomposition temperature of the plastic material.

Metals, such as aluminum, for example, may, in fact, be deposited at lower temperatures. However, they have a tendency to creep already under low mechanical loads, which, in the case of a multiple occurrence, can lead over the long term to irreversible deformations of mechanical functional elements, respectively to a change in the mechanical properties thereof. This then manifests itself as drift of the component signal. Moreover, the originally adjusted mechanical strain condition changes at high temperatures, as occur, for example, during the soldering process or during thermal cycling.

BRIEF SUMMARY OF THE INVENTION

The present invention provides for integrating at least one metal-ceramic multilayer stack in the layered structure of an MEMS component of the type mentioned at the outset. In accordance with the present invention, the metal-ceramic multilayer stack functions as a mechanical functional layer in which at least one component of the micromechanical structure of the MEMS component is configured.

Metal-ceramic multilayer stacks were developed as an alternative to metallic printed conductor materials, in particular, as an alternative to aluminum layers, which, at a thickness of approximately 3.5 μm that is typical for printed conductors, have a relatively low creep limit. In the case of metal-ceramic multilayer stacks, one makes use of the fact that the creep limit of a metal layer is all the higher, the thinner this metal layer is. Thus, for example, the creep limit of a 500 nm thick Al layer is already so high that it withstands temperatures, as occur, for example, in the course of a soldering process, without there being any appreciable change in mechanical properties, such as layer stress, for example. However, the electrical resistance of such a thin Al layer is too high for realizing narrow printed conductors in highly integrated circuits. Therefore, a plurality of thin metal layers, which are separated by very thin ceramic layers, may be combined in metal-ceramic multilayer stacks. It turns out that the creep limit of such a multilayer stack is on the order of magnitude of one of the thin metal layers, while the electrical resistance is significantly lower.

It has been recognized by the present invention that metal-ceramic multilayer stacks of this kind may not only be used as printed conductor material, but that they also have outstanding mechanical properties, so that they may also be advantageously utilized as a functional layer for realizing fixed, but also movable micromechanical structural elements. It is, thus, possible, for example, to very precisely adjust the mechanical strain condition and the thermal expansion coefficient of a metal-ceramic multilayer stack. It is also advantageous in this context that metal-ceramic multilayer stacks may be produced at comparatively low temperatures. This makes it possible to use temperature-sensitive thin layer materials and processes in the manufacturing of the MEMS components according to the present invention, in particular, before the mechanical functional layers are produced. Thus, for example, plastics, such as polymers, may also be used as sacrificial layer materials.

In principle, there are many possible ways to realize this type of metal-ceramic multilayer stack as a mechanical functional layer that relate to the materials, the layer thicknesses, as well as to the number and sequence of the layers. Since these parameters determine both the electrical, as well as mechanical properties of the metal-ceramic multilayer stack, the selection thereof depends to a significant degree on the function and configuration of the particular MEMS component.

In one preferred specific embodiment of the present invention, the metal-ceramic functional layer is composed of aluminum copper (AlCu) layers and titanium nitride (TiN, respectively Ti/TiN) intermediate layers. This variant is particularly rugged and temperature-resistant, and also features outstanding elastic and electrical properties, and the compatibility thereof to semiconductor processes. The aluminum-copper alloy may be made, for example, of 99.5% aluminum Al and of 0.5% of copper and have a layer thickness of approximately 500 nm, while the layer thickness of the TiN intermediate layers could be in the 10 nm region. In any case, the layer thicknesses should be preferably be selected in a way that allows the grain sizes of the individual layers of the multilayer stack to remain as small as possible. The multilayer stack is composed of at least two metal-ceramic layer sequences, given preferably the same individual layer thicknesses.

To produce such a TiN/AlCu multilayer functional layer in the course of manufacturing an MEMS component according to the present invention, at least one Ti/TiN layer is advantageously initially deposited on a coated or also uncoated substrate. This may be in the context of a switching process. The Ti/TiN layer is used as an adhesion-promoting layer and is generally thinner than 200 nm. Moreover, AlCu layers are deposited to alternate with TiN—, respectively Ti/TiN layers, for example, by a sputtering process, and, in fact, until the desired target thickness of the functional layer is reached. The terminating layer likewise advantageously forms a TiN—, respectively a Ti/TiN layer.

As already mentioned, the AlCu layers should be as thin as possible in order to prevent large Al grains from forming within the AlCu layer. The Ti/TiN intermediate layers, which promote the formation of very fine-grained AlCu layers, also contribute thereto. Since the grain boundaries act as a barrier to any sliding of dislocations, a multilayer stack of this kind features a very high creep limit. Moreover, the creep of the aluminum is thereby prevented or at least significantly reduced, even at high temperatures. In addition, such a TiN/AlCu functional layer is elastically extensible within a comparatively broad temperature and layer stress range, which proves to be advantageous, in particular, for realizing movable micromechanical structural elements.

In the context of an MEMS component according to the present invention, besides the mechanical properties of a metal-ceramic functional layer, the electrical properties thereof may also be utilized. Accordingly, in one advantageous further embodiment of the present invention, at least one component of the micromechanical structure configured in the metal-ceramic functional layer functions as an electrode. Depending on the function of the MEMS component, this may be used for signal acquisition or also for controlling individual structural elements.

It is explicitly noted again at this point that very different fixed or also movable micromechanical structural elements may be realized in metal-ceramic functional layers. Accordingly, the present invention is not limited to MEMS components having a specific function and/or design.

DETAILED DESCRIPTION OF THE INVENTION

Figure 1:
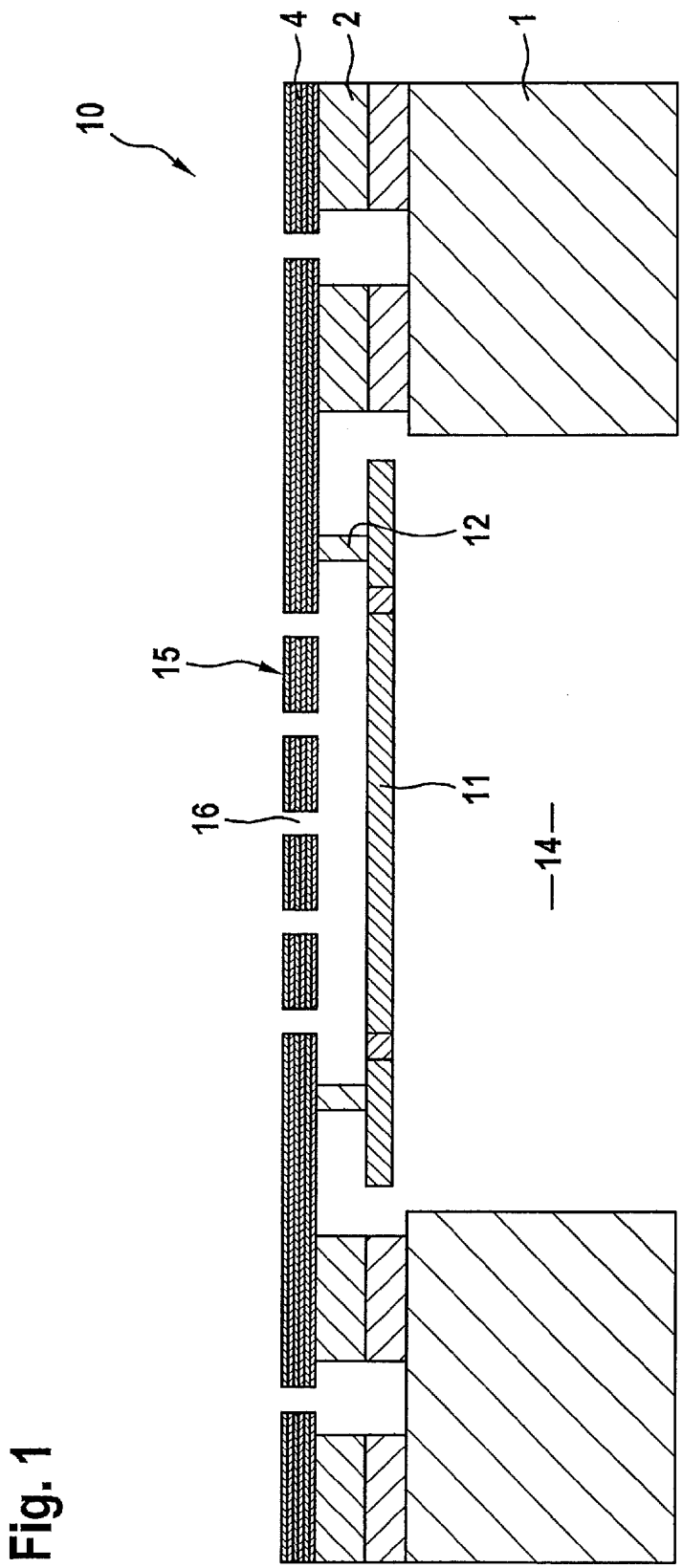
FIG. 1 shows a schematic sectional view through a first MEMS component 10 according to the present invention having a microphone structure.

MEMS component 10 shown in FIG. 1 is a microphone component, whose micromechanical structure is realized in a layered structure on a substrate 1. It may be a semiconductor substrate, such as a silicon wafer, for example. The microphone structure includes an acoustically active diaphragm 11 which spans a sound port 14 in the substrate rear side and is constructed from a polysilicon layer of the layered structure. Moreover, the microphone structure includes a fixed, acoustically transmissive counter element 15 having perforations that is configured in the layered structure over diaphragm 11. Fixed counter element 15 is formed here in a metal-ceramic functional layer 4, and, in fact, from a TiN/AlCu multilayer stack. The tensile strain of this metal-ceramic functional layer 4 contributes to the stiffness of counter element 15. The electrical conductivity of metal-ceramic functional layer 4 is also utilized here in that fixed counter element 15 functions as an electrode and, together with deflectable diaphragm 11, forms a microphone capacitor. Diaphragm 11 is connected via spring elements 12 in the edge region to fixed counter element 15. Since this spring suspension 12 is constructed from an electrically insulating intermediate layer 2, diaphragm 11 and counter element 15 are electrically insulated from one another. The TiN separation layers between the AlCu layers of metal-ceramic functional layer 4 prevent a creep of the AlCu layers both during the reflow soldering process at approximately 280° C. in the course of the manufacturing of component 10, as well as during operation, so that the microphone performance is not substantially changed over the entire service life of component 10.

Figure 2:
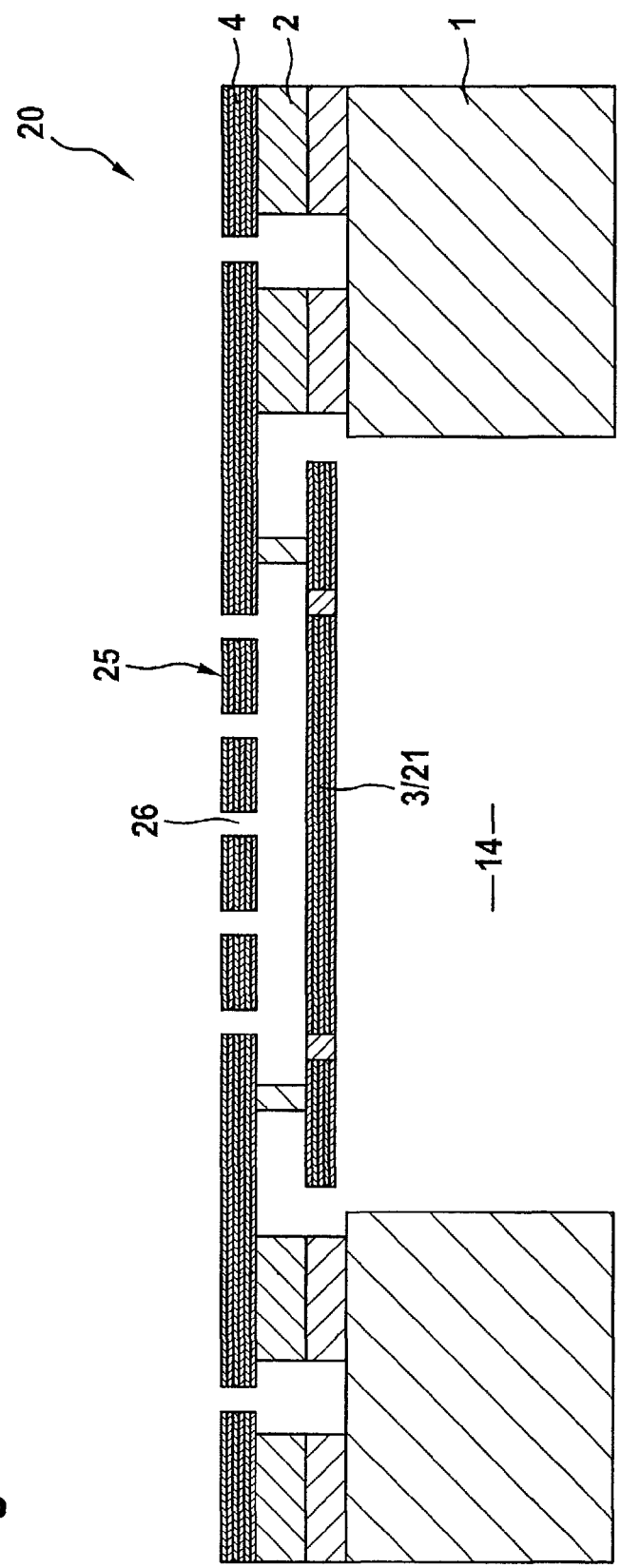
FIG. 2 shows a schematic sectional view through a second MEMS component 20 according to the present invention having a microphone structure.

In the case of MEMS component 20 shown in FIG. 2, it is likewise a capacitive microphone component, whose microphone structure is realized in a layered structure on a substrate 1. Here, as well, the microphone structure includes an acoustically active diaphragm 21, which spans a sound port 14 in the substrate rear side, and a fixed, acoustically transmissive counter element 25 having perforations 26 that is configured in the layered structure over diaphragm 21. In contrast to microphone component 10 described above, here, however, exactly as in the case of counter element 25, diaphragm 21 is realized in a metal-ceramic functional layer 3 in the form of a TiN/AlCu multilayer stack. This makes it possible to adjust an accurate stress condition in diaphragm 21 that neither changes in the manufacturing process during reflow soldering, nor over the service life of component 20. Diaphragm 21 is connected via an electrically insulating suspension element 12 to counter element 25. As in the case of microphone component 10, diaphragm 21 and counter element 25 also form the electrodes of a microphone capacitor used for signal acquisition in the case of microphone component 20 as well.

Figure 3:
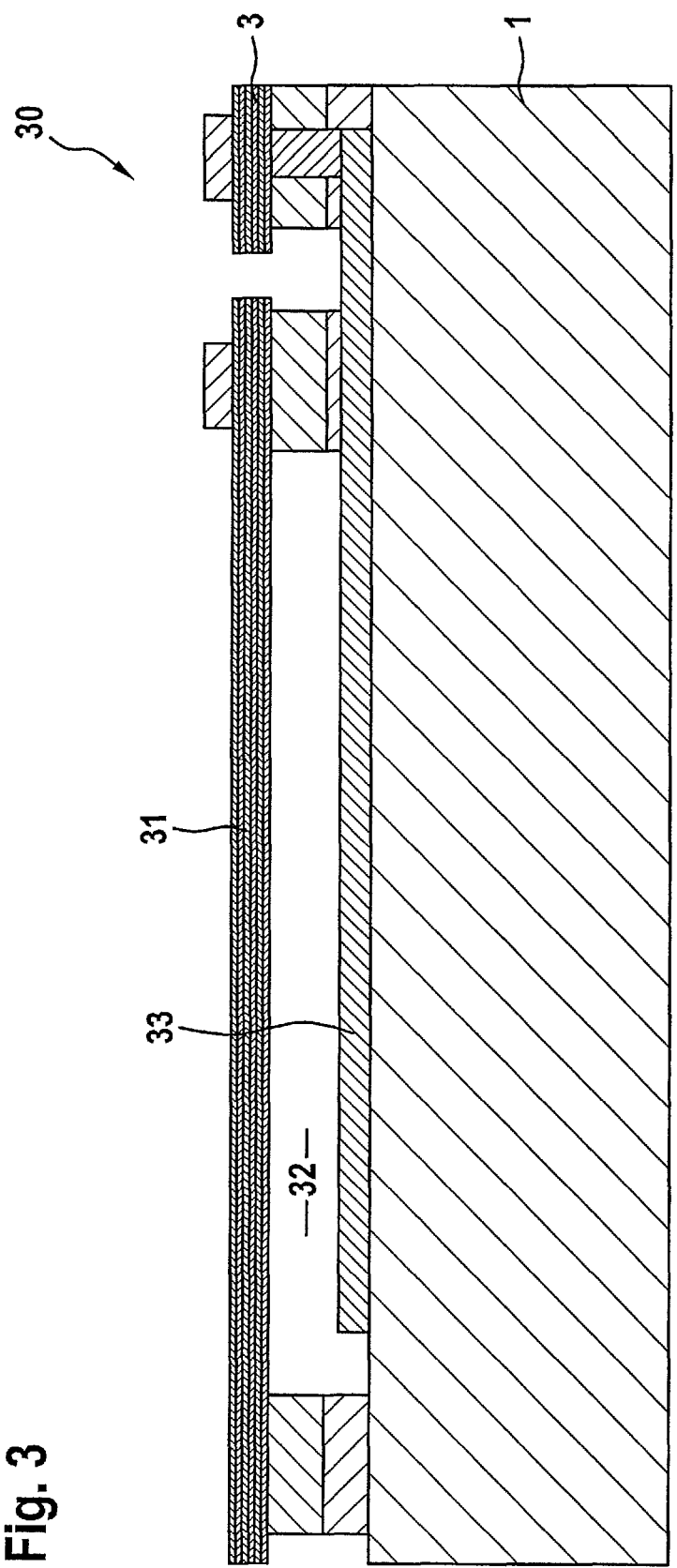
FIG. 3 shows a schematic sectional view through a third MEMS component 30 according to the present invention that is configured as a pressure sensor.

MEMS component 30 illustrated in FIG. 3 is used for sensing absolute pressure. Here as well, the component structure is configured in a layered structure on a substrate 1. It includes a pressure-sensitive diaphragm 31 in the top side of component 30 that spans and closes a cavity 32 within the layered structure. Diaphragm 31 is formed here in a metal-ceramic functional layer 3, and, in fact, from a TiN/AlCu multilayer stack, which makes possible a precise adjustment of the stress condition of diaphragm 31, which, due to the increased creep limit of the multilayer stack, changes neither in the manufacturing process during reflow soldering, nor over the service life of component 30.

The signal acquisition is carried out capacitively in the case of component 30 as well, diaphragm 31 being utilized as a measuring electrode. Together with an electrode 33, it forms a measuring capacitor configuration at the bottom of cavity 32.

What is claimed is:
1. A MEMS component, comprising:
   a micromechanical structure configured in a layered structure on a substrate, wherein individual components of the micromechanical structure are configured in each case in a mechanical functional layer of the layered structure, and
   wherein at least one mechanical functional layer of the layered structure is realized in the form of a metal-ceramic multilayer stack, the metal-ceramic functional layer having at least two layer sequences each including metal and ceramic.
2. The MEMS component as recited in claim 1, wherein the metal-ceramic functional layer includes aluminum copper layers and titanium nitride intermediate layers.

3. The MEMS component as recited in claim 2, wherein the lowermost layer and the uppermost layer of the metal-ceramic functional layer are each formed by a titanium nitride layer.

4. The MEMS component as recited in claim 2, wherein the layer thickness of the individual layers of the metal-ceramic functional layer is between 10 nm to 500 nm.

5. The MEMS component as recited in claim 2, wherein at least one component of the micromechanical structure configured in the metal-ceramic functional layer functions as an electrode.

6. The MEMS component as recited in claim 2, wherein the MEMS component has a micromechanical microphone structure and includes:

at least one acoustically active diaphragm which spans a sound port in the substrate rear side; and at least one fixed, acoustically transmissive counter element having perforations, wherein the counter element is configured in a layered structure extending parallel to the diaphragm;

wherein at least one of the diaphragm and the counter element is configured in the metal-ceramic functional layer.

7. The MEMS component as recited in claim 2, wherein the MEMS component has a micromechanical diaphragm for recording pressure, and wherein the diaphragm is formed in the metal-ceramic functional layer and functions as an electrode of a capacitor configuration used for signal acquisition.

8. The MEMS microphone component as recited in claim 6, wherein at least one of the diaphragm and the counter element configured in the metal-ceramic functional layer functions as an electrode of a capacitor configuration used for signal acquisition.

* * * * *